(12) United States Patent
Ho et al.

(10) Patent No.: US 10,818,595 B2
(45) Date of Patent: Oct. 27, 2020

(54) SEMICONDUCTOR STRUCTURE, TESTING AND FABRICATING METHODS THEREOF

(71) Applicant: TAIWAN SEMICONDUCTOR MANUFACTURING CO., LTD., Hsinchu (TW)

(72) Inventors: Yen-Hsung Ho, Taoyuan County (TW); Chia-Yi Tseng, Tainan (TW); Chih-Hsun Lin, Tainan (TW); Kun-Tsang Chuang, Miaoli County (TW); Yung-Lung Hsu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 49 days.

(21) Appl. No.: 15/486,598

(22) Filed: Apr. 13, 2017

(65) Prior Publication Data
US 2018/0151458 A1    May 31, 2018

Related U.S. Application Data

(60) Provisional application No. 62/427,277, filed on Nov. 29, 2016.

(51) Int. Cl.
| | | |
|---|---|---|
| *H01L 21/66* | (2006.01) | |
| *H01L 23/528* | (2006.01) | |
| *H01L 23/544* | (2006.01) | |
| *H01L 29/40* | (2006.01) | |
| *H01L 23/522* | (2006.01) | |

(52) U.S. Cl.
CPC .......... *H01L 23/5283* (2013.01); *H01L 22/14* (2013.01); *H01L 22/34* (2013.01); *H01L 23/5226* (2013.01); *H01L 23/544* (2013.01); *H01L 29/401* (2013.01)

(58) Field of Classification Search
CPC . H01L 22/32; H01L 23/5283; H01L 23/5226; H01L 22/12; H01L 21/223; H01L 21/76804; H01L 29/401; H01L 21/76877; H01L 23/544; H01L 22/14
See application file for complete search history.

(56) References Cited

U.S. PATENT DOCUMENTS

| | | | |
|---|---|---|---|
| 6,720,779 B1 * | 4/2004 | Lee ...................... | G01R 31/305 324/754.22 |
| 2008/0318393 A1 * | 12/2008 | Akao ................ | H01L 21/76816 438/453 |

(Continued)

FOREIGN PATENT DOCUMENTS

WO    WO-2013046859 A1 *   4/2013   ........... G06T 7/0004

*Primary Examiner* — Steven H Loke
*Assistant Examiner* — Samuel Park
(74) *Attorney, Agent, or Firm* — McClure, Qualey & Rodack, LLP

(57) ABSTRACT

A method of fabricating a semiconductor structure includes forming first and second features in a scribe region of a semiconductor substrate in which the first feature has a first electrical resistance, the second feature has a second electrical resistance, and the first electrical resistance is different form the second electrical resistance; forming an interlayer dielectric layer over the first and second features; and forming a first contact in the interlayer dielectric layer and connected to the first feature and a second contact in the interlayer dielectric layer and connected to the second feature.

15 Claims, 7 Drawing Sheets

(56) References Cited

U.S. PATENT DOCUMENTS

| | | | |
|---|---|---|---|
| 2011/0013826 A1* | 1/2011 | Xiao | G01R 31/307 |
| | | | 382/149 |
| 2011/0036981 A1* | 2/2011 | Zhao | G01N 23/2206 |
| | | | 250/307 |
| 2016/0372303 A1* | 12/2016 | Park | H01J 37/222 |

* cited by examiner

SEMICONDUCTOR STRUCTURE, TESTING AND FABRICATING METHODS THEREOF

PRIORITY CLAIM AND CROSS-REFERENCE

This application claims priority to U.S. Provisional Application Ser. No. 62/427,277, filed Nov. 29, 2016, which is herein incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
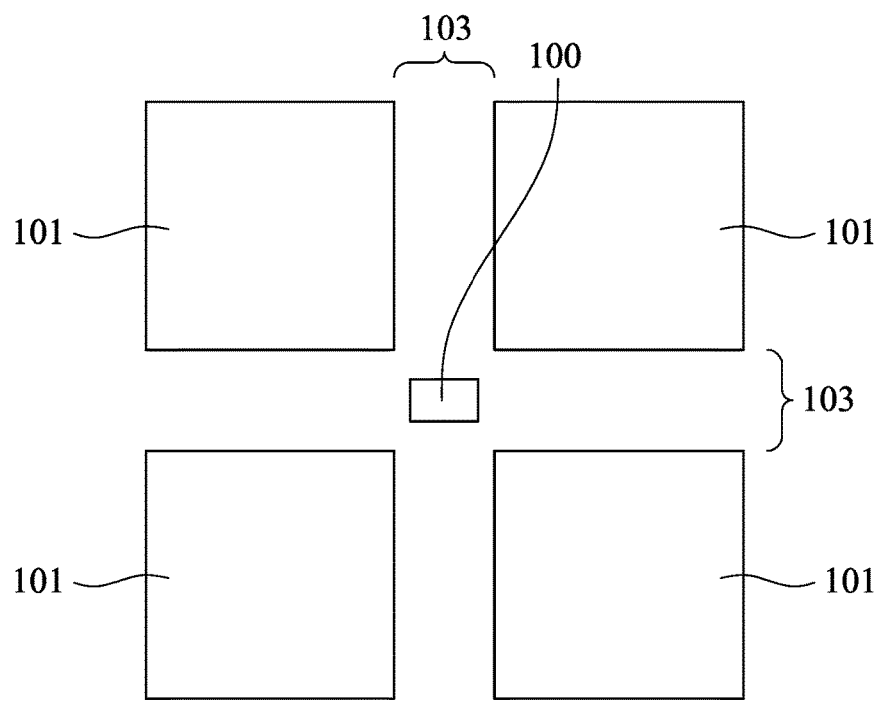
FIG. 1 is a plan view of dummy structure layouts in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a plan view of dummy structure layouts in accordance with some embodiments of the present disclosure. With reference to FIG. 1, there is shown some embodiments comprising a plurality of individual dies 101 on a wafer, wherein each die 101 includes a substrate (not shown) having electronic devices formed thereon. The substrate is covered with one or more dielectric layers and one or more metal layers (not shown) between adjacent dielectric layers. The metal layers provide connectivity and routing for the underlying electronic devices. There can be any number of alternating layers of metal layers and dielectric layers located on the die 101, but a range of layers would be from three layers to twelve layers of alternating metal layers and dielectric layers.

Separating the individual dies 101 are scribe lines 103, which form an area for a saw to be used to separate the die 101 from the wafer. The scribe lines 103 can be referred to as a scribe region. In some embodiments, scribe lines 103 run substantially parallel to the edges of the individual dies 101. Accordingly, the scribe lines 103 intersect each other at the corners of the dies 101 to form a junction region.

The scribe lines 103 are formed by not placing functional structures (structures that will be used by the die 101 once it has been cut from the wafer) into the area intended for the scribe line 103. Other structures, such as test pads or dummy metals used for planarization, could be placed into the scribe line 103, but would not be necessary for the functioning of the die 101 once the die 101 has been cut from the wafer. The scribe lines 103 may have a width of between about 20 μm and about 180 μm. Within the scribe lines 103 is placed at least one dummy structure 100.

Figure 2:
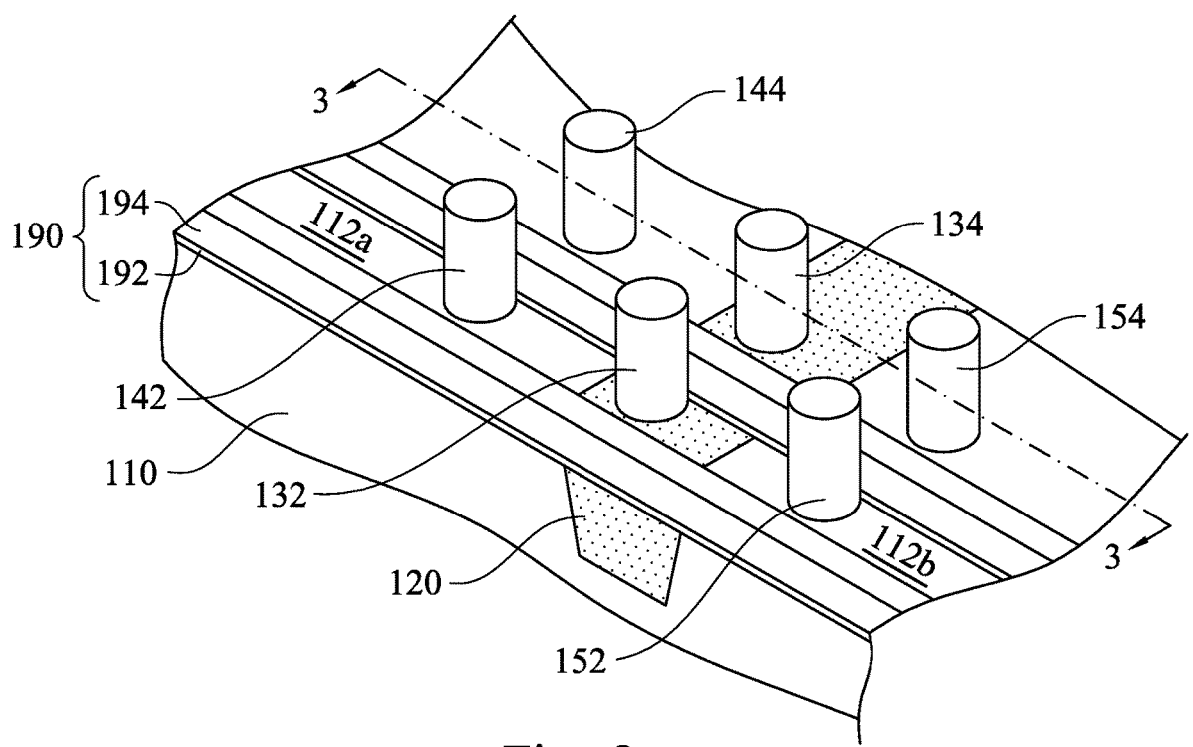
FIG. 2 is a perspective view of a dummy structure in accordance with some embodiments of the present disclosure.

FIG. 2 is a perspective view of a dummy structure 100 in accordance with some embodiments of the present disclosure. As shown in FIG. 2, the dummy structure 100 includes a substrate 110 and an isolation structure 120 in a trench of the substrate 110. The substrate 110 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 110 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 110 may be doped with a p-type dopant or an n-type dopant.

The isolation structure 120 in the trench of the substrate 110 may be a shallow trench isolation (STI) structure embedded in the substrate 110, and is referred to as an STI structure 120 hereinafter. The STI structure 120 includes a material such as silicon oxide, silicon nitride, silicon oxynitride, low-k materials, other suitable materials, or any combinations thereof. In some embodiments, an optional thermal oxide trench liner is grown to improve the trench interface.

The dummy structure 100 includes first contacts 142 and 144 on a first active region (OD) 112a of the substrate 110, second contacts 132 and 134 on the STI structure 120, and third contacts 152 and 154 on a second active region 112b of the substrate 110. For example, the first contacts 142 and 144 are in contact with the first active region 112a, the second contacts 132 and 134 are in contact with the STI structure 120, and the third contacts 152 and 154 are in contact with the second active region 112b, and hence the first and third contacts 142, 144, 152, and 154 have electrical resistances different from electrical resistances of the second contacts 132 and 134. More particularly, the first contacts 142 and 144 are electrically isolated from the second contacts 132 and 134 at least by the STI structure 120, and the third contacts 152 and 154 are electrically isolated from the second contacts 132 and 134 at least by the STI structure 120 as well. Such an electrical isolation between the first and second contacts 142, 144, 132, 134 and between the third and second contacts 152, 154, 132, and 134 may be advantageous to detect an unwanted electrical connection between the first and second contacts or between the third and second contacts.

Figure 3:
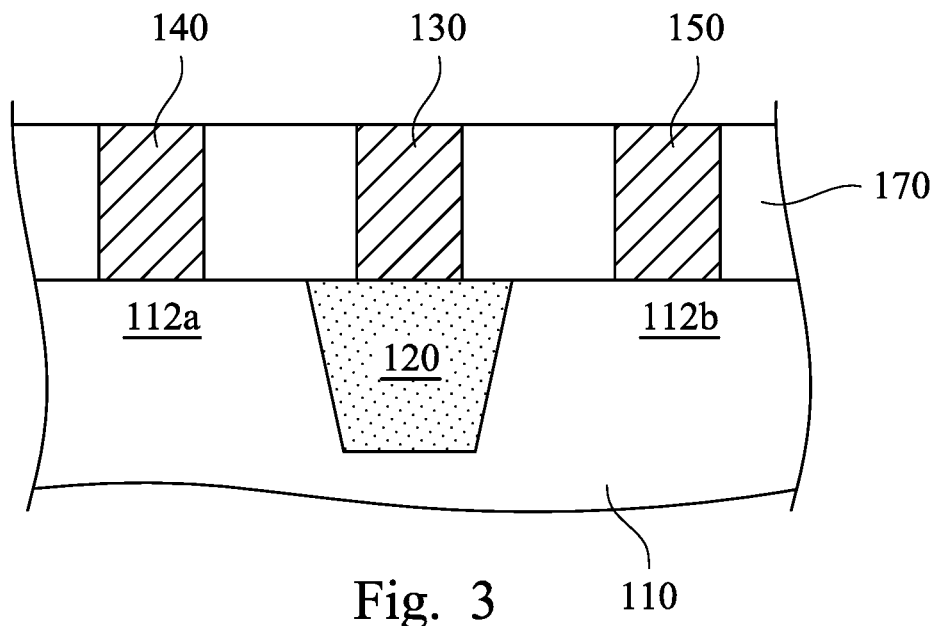
FIG. 3 is a cross-sectional view taken along line 3 in FIG. 2.

For example, scanning electron microscope (SEM) can be used to detect the unwanted electrical connection between contacts. As illustrated in FIG. 3, which is a cross-sectional view taken along line 3 in FIG. 2, an electron beam can be applied to the first and third contacts 140 and 150 (i.e. the first contacts 142 and 144 and the third contacts 152 and 154 in FIG. 2) landing on the first and second active regions 112a and 112b, and applied to the second contacts 130 (i.e. the second contacts 132 and 134 in FIG. 2) landing on the STI structure 120. In the depicted embodiments where the first, second, the second contacts 130 are electrically isolated from the first and third contacts 150. Therefore, electrons cannot be discharged from the substrate 110 due to electrical isolation of the STI structure 120. The electron beam does not penetrate the second contacts 130 when electron charge is accumulated therein, such that the number of second electrons detected from the second contacts 130 is decreased. In contrast, connection between the first contacts 140 and first active region 112a releases electrons through the substrate 110, and connection between the third contacts 150 and second active region 112b releases electrons through the substrate 110. Therefore, images of the second contacts 130 observed using SEM are darker than images of the first and third contacts 140 and 150 observed using SEM.

Figure 4:
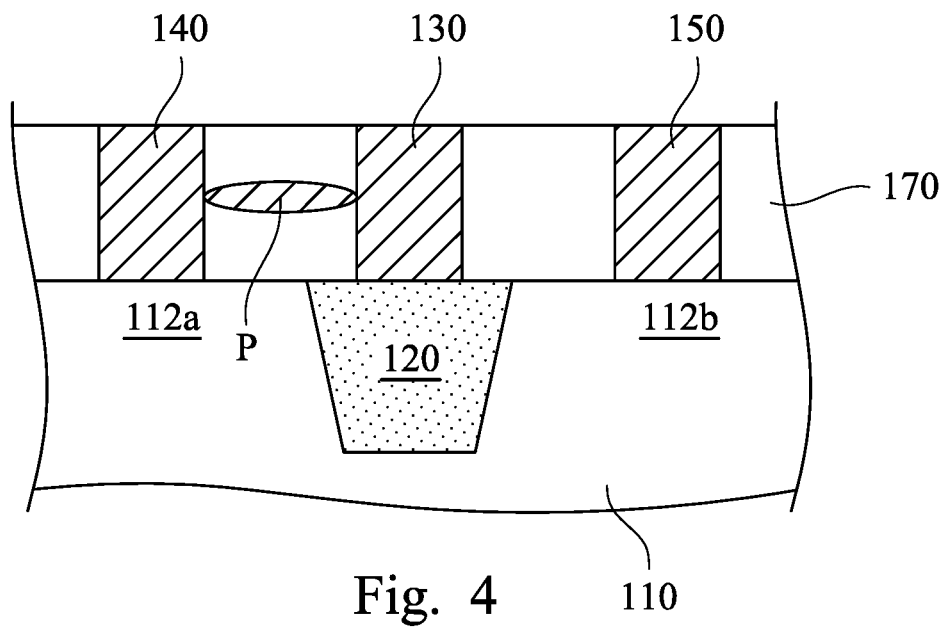
FIG. 4 is a cross-sectional view of a dummy structure with an unwanted electrical connection between contacts in accordance with some embodiments of the present disclosure.

On the other hand, as shown in FIG. 4, which illustrates an unwanted electrical connection P connected between the first and second contacts 140 and 130, the first and second contacts 140 and 130 are not electrically isolated due to the unwanted electrical connection P. Therefore, when an electron beam is applied to the first and second contacts 140 and 130, no charge or less charge accumulates on the second contact 130 because the unwanted electrical connection P allows electrical connection between the first and second contacts 140 and 130. Electrons from the second contact 130 thus transfer to the unwanted electrical connection P, and discharge together with the electrons from the first contact 140 through the substrate 110. Therefore, an image of the second contact 130 observed using SEM may have substantially the same brightness as images of the first and third contacts 140 and 150 observed using SEM.

As stated above, an SEM image of the second contact 130 has substantially the same brightness as SEM images of the first and third contacts 140 and 150 when the unwanted electrical connection P exists, but an SEM image of the second contact 130 is darker than SEM images of the first and third contacts 140 and 150 when the unwanted electrical connection P does not exists. Accordingly, the unwanted electrical connection P can be detected or inspected according to brightness contrast between the first and second contacts 140 and 130 or between the second and third contacts 130 and 150. In some embodiments, detection of the unwanted electrical connection P is not limited to usage of the scanning electron microscope, other devices having an electron beam can also be utilized as an inspection device.

In some embodiments, the unwanted electrical connection P may be a piping defect in an interlayer dielectric (ILD) layer 170 between the first and second contacts 140 and 130. More particularly, with reduced process size and increased integration, voids with piping shapes (not shown) easily form among gates due to the low filling capability of the ILD layer 170, and the voids may connect contact holes. As the contact holes are filled with a conductive material to form contacts, the conductive material fills the voids as well, and thus the conductive material in the voids forms the unwanted electrical connection P, which can be referred to as piping defects. Some contacts (e.g. first and second contacts 140 and 130 in FIG. 4) thus connect to each other due to the piping defects. When an electron beam is applied to the first, second, and third contacts 140, 130, and 150, images of the first and second contacts 140 and 130 may have substantially the same brightness if the piping defect exists therebetween, and the piping defect can thus be detected.

In some embodiments, as shown in FIG. 2, gate structures 190 are over the first and second active region 112a and 112b. At least one gate structure 190 is between the first contacts 142 and 144, and hence portions of the first active region 112a under the first contacts 142 and 144 can be doped as source/drain regions using an n type dopant or a p type dopant. Similarly, at least one gate structure 190 is between the third contacts 152 and 154, and hence portions of the second active region 112b under the third contacts 152 and 154 can be doped as source/drain regions using an n type dopant or a p type dopant. The first and third contacts 142, 144, 152, and 154 landing on the source/drain regions are located on the scribe lines 103 (shown in FIG. 1), and hence the source/drain regions and the gate structure 190 therebetween may not act as functional transistors. In some embodiments, the gate structure 190 extends over the STI structure 120 and is also between the second contacts 132 and 134. As a result, first, second and third contacts are present between the gate structures 190 so as to detect the piping defect between the gate structures 190. In some embodiments, the gate structure 190 may include a stack of a gate dielectric layer 192 and a gate electrode 194, as illustrated in FIG. 2. Some elements, such as gate spacers on opposite sides of the gate structure 190 and ILD layers over the substrate 110, are not illustrated in FIG. 2 for clarity.

Figure 5:
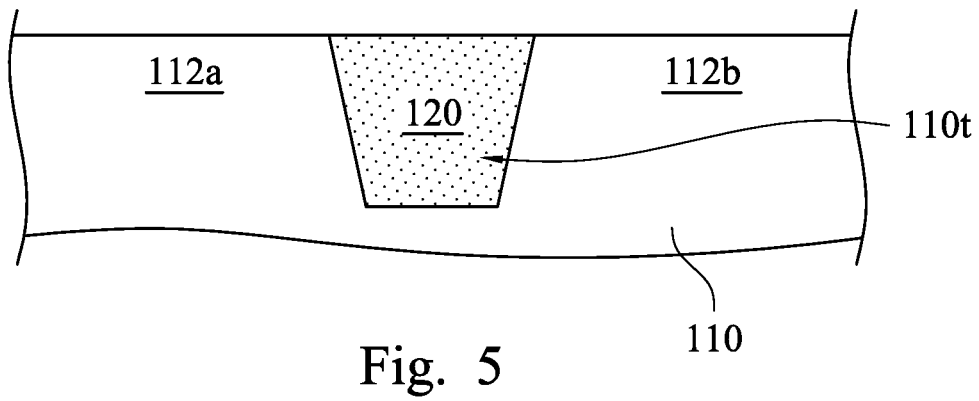
FIG. 5 to FIG. 8 illustrate a method for manufacturing a dummy structure at various stages in accordance with some embodiments of the present disclosure.

The first, second and third contacts can be formed using, for example, a damascene process as shown in FIG. 5 to FIG. 8. As shown in FIG. 5, the STI structure 120 is formed in the substrate 110, and the first and second active regions 112a and 112b are defined by the STI structure 120. In other words, the STI structure 120 abuts the first and second active regions 112a and 112b, and is disposed between the first and second active regions 112a and 112b. Formation of the STI structure 120 may include etching the substrate 110 to form a trench 110t, and filling the trench 110t with a dielectric material to form the STI structure 120. The STI structure 120 may be formed of silicon oxide deposited by a high density plasma, for example, although other dielectric materials formed according to various techniques may also be used. In some embodiments, top surfaces of the first and second active regions 112a and 112b and a top surface of the STI structure 120 may be substantially level with each other, such as by performing a chemical mechanical polish (CMP) process after depositing the material of the STI structure 120, although the surfaces may be at slightly different levels.

Thereafter, one or more gate structures (not shown in this figure) may be formed over the first and second active regions 112a and 112b, and source/drain regions can be formed in the first and second active regions 112a and 112b before or after the formation of the gate structures, for example, using a suitable technique, such as implant processes or combinations of epitaxy processes and implant processes.

Figure 6:
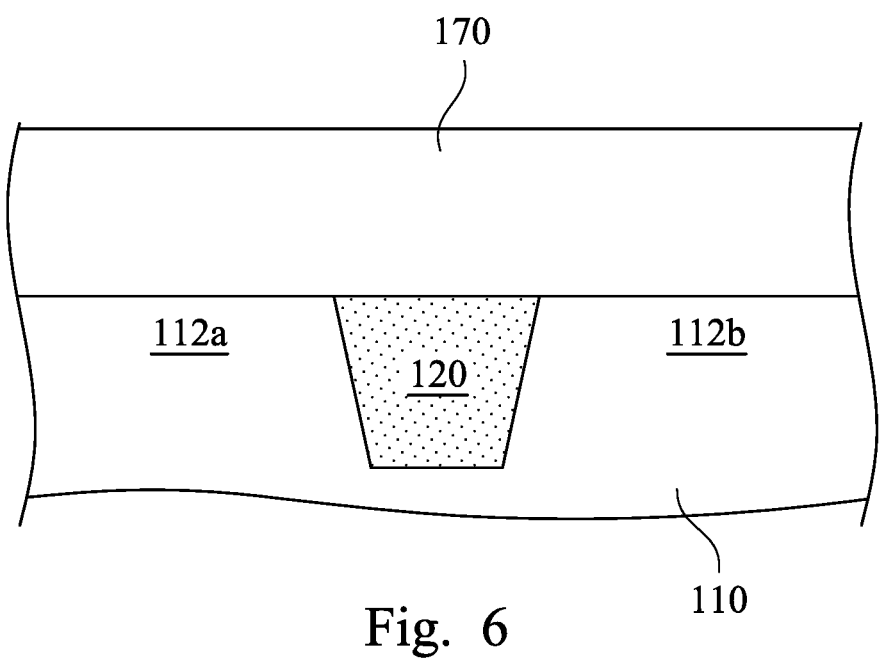
Figure 7:
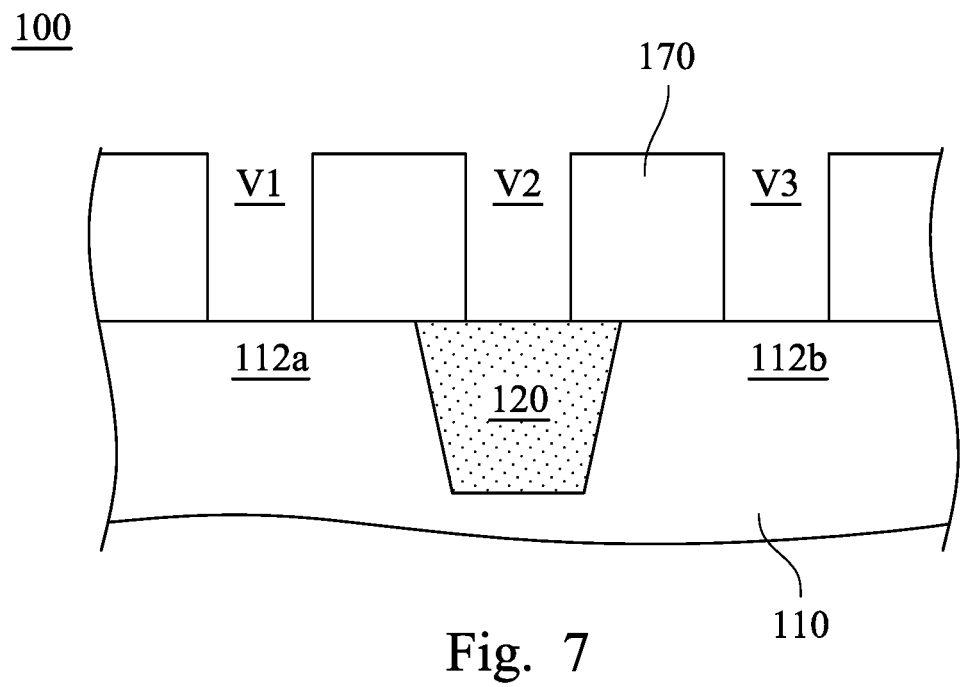

Next, as shown in FIG. 6, the ILD layer 170 is deposited on the substrate 110. Portions of the ILD layer 170 are then etched away where contact holes are to be formed. Continuing in FIG. 7, the ILD layer 170 is subjected to a photolithography and etching process to form contact holes V1, V2 and V3 for the subsequently formed contacts. In some embodiments, the etching of the contact holes V1 and V3 stops on the first and second active regions 112a and 112b, and the etching of the contact hole V2 stops on the STI structure 120, and hence the first and second active regions 112a and 112b and the STI structure 120 are respectively exposed at bottoms of the via openings V1, V3, and V2.

Figure 8:
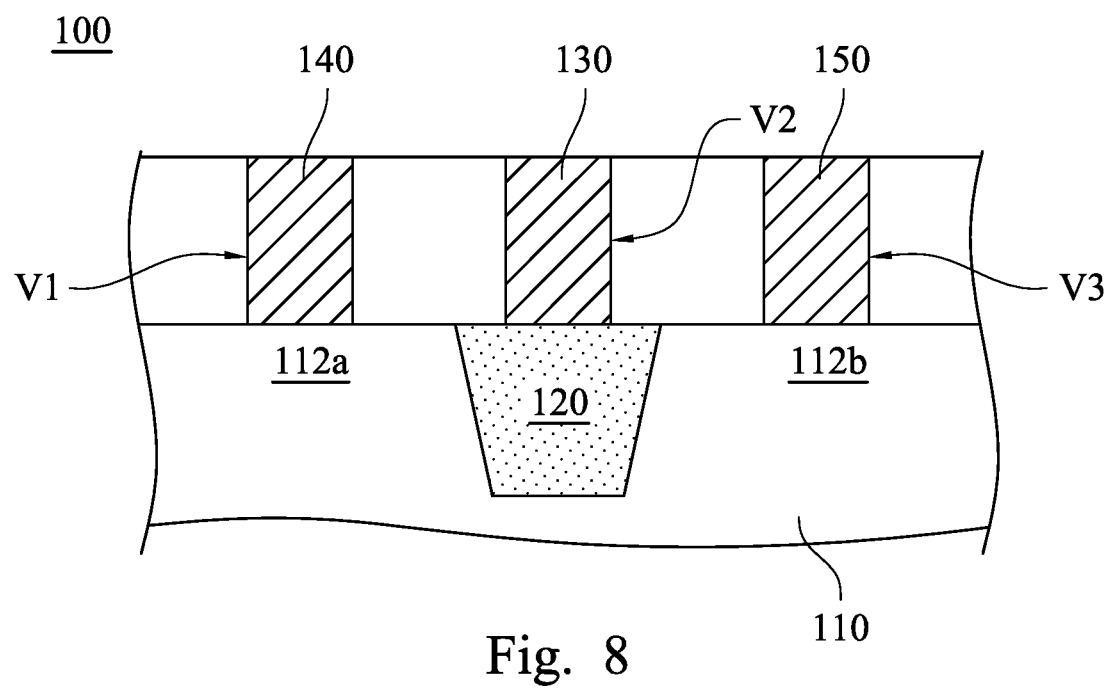

As illustrated in FIG. 8, the contact holes V1, V2, and V3 are then filled with conductor utilizing suitable deposition processes, such as chemical vapor deposition (CVD), plasma-assisted CVD, sputtering, electroplating, or the like. In some embodiments, the contact holes V1, V2, and V3 are filled with conductor to form a damascene structure over the substrate 110. The amascene structure is then planarized to remove excess conductor from its top surface and to provide a substantially flat surface for the subsequent processing steps. Since the first and second active regions 112a and 112b and the STI structure 120 are respectively exposed at bottoms of the contact holes V1, V3, and V2, the first, third, and second contacts 140, 150, and 130 can be in contact with the first and second active regions 112a and 112b and the STI structure 120, respectively.

Figure 9:
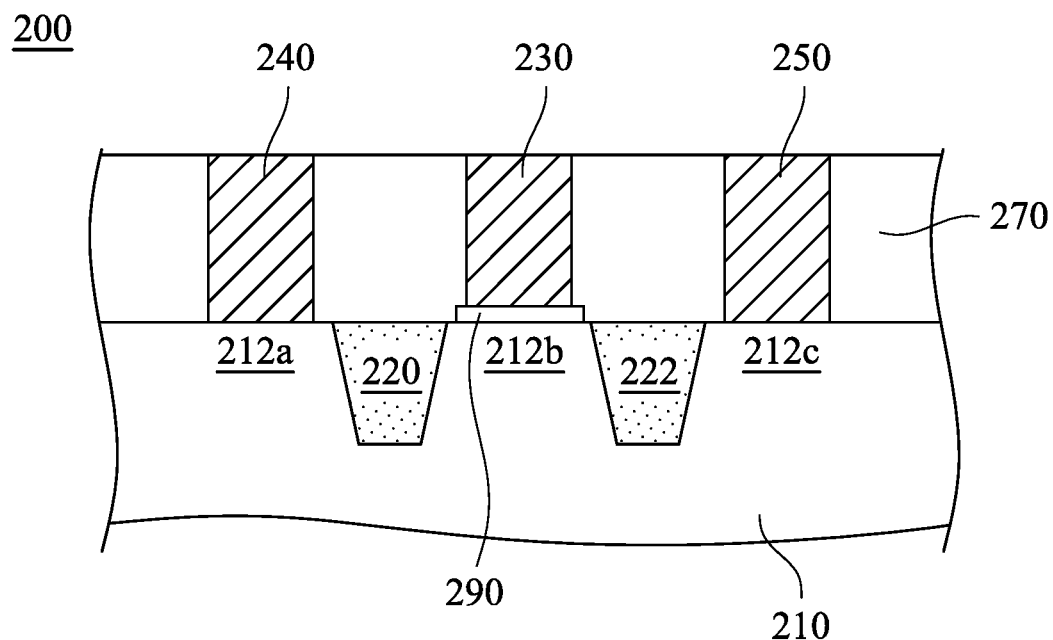
FIG. 9 is a cross-sectional view of a dummy structure in accordance with some embodiments of the present disclosure.

FIG. 9 is a cross-sectional view of a dummy structure 200 in accordance with some embodiments of the present disclosure. As shown in FIG. 9, the dummy structure 200 includes a substrate 210, a first isolation structure 220 in a trench of the substrate 210, and a second isolation structure 222 in another trench of the substrate 210. The first isolation structure 220 is between a first active region 212a and a second active region 212b of the substrate 210, and the second isolation structure 222 is between the second active region 212b and a third active region 212c of the substrate 210. In other words, the first and second active regions 212a and 212b are separated by the STI structure 220, and the second and third active regions 212b and 212c are separated by the STI structure 222. The substrate 210 may comprise a semiconductor material as discussed previously. The first and second isolation structures 220 and 222 may be referred to as first and second STI structures 220 and 222, and may comprise dielectric materials as discussed previously. The dummy structure 200 further includes a dielectric structure 290 formed over the second active region 212b of the substrate 210. The dielectric structure 290 may be a resist protective oxide (RPO), and is referred to as an RPO structure 290 hereinafter. The RPO structure 290 is deposited over substrate 210 and then selectively removed where silicidation is desired. The RPO structure 290 will prevent silicidation where it remains over the substrate 210.

The dummy structure 200 includes first and third contacts 240 and 250 on the first and third active region 212a and 212c of the substrate 210, and second contacts 230 on the RPO structure 290. For example, the first and third contacts 240 and 250 are in contact with the first and third active regions 212a and 212c respectively, and the second contacts 230 are in contact with the RPO structure 290, and hence the first and third contacts 240 and 250 may have electrical resistances different from electrical resistances of the second contacts 230. More particularly, the first and third contacts 240 and 250 are electrically isolated from the second contacts 230 at least by the RPO structure 290. Such an electrical isolation between the first and second contacts 240 and 230 and between the third and second contacts 250 and 230 may be advantageous to detect an unwanted electrical connection between the first and second contacts 240 and 230 or between the third and second contacts 250 and 230.

Figure 10:
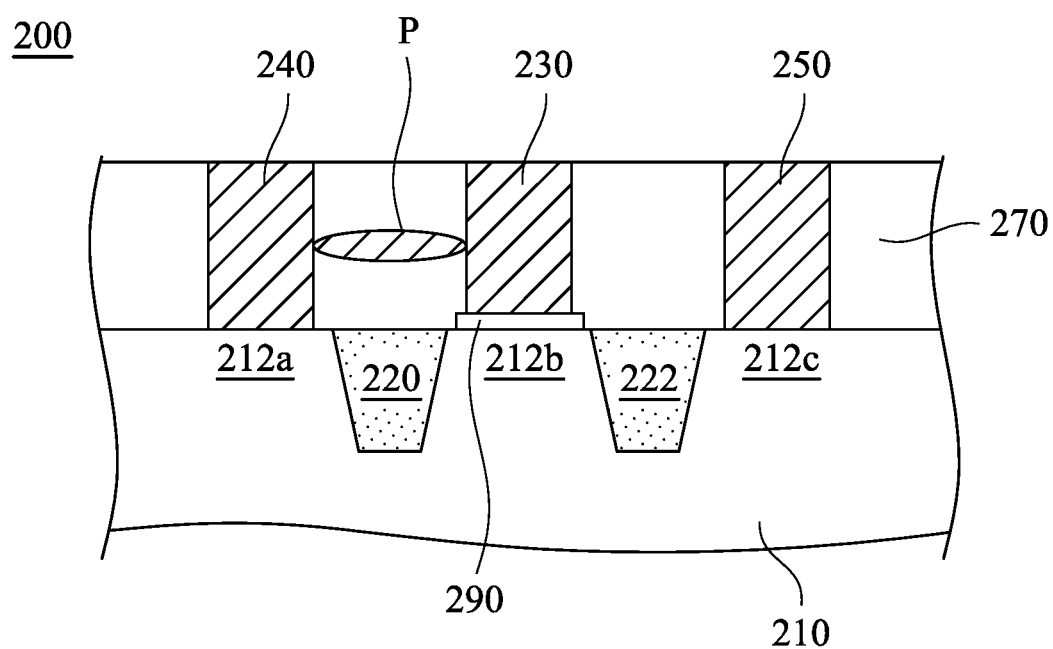
FIG. 10 is a cross-sectional view of a dummy structure with an unwanted electrical connection between contacts in accordance with some embodiments of the present disclosure.

For example, in the depicted embodiments where the first and second contacts 240 and 230 are free from unwanted electrical connections (e.g. piping defects), the first and second contacts 240 and 230 can be electrically isolated at least by the RPO structure 290. Therefore, when the first and second contacts 240 and 230 are observed by SEM or other suitable techniques, the image of the second contact 230 may be darker than the image of the first contact 240. On the other hand, as shown in FIG. 10, which illustrates an unwanted electrical connection P (e.g. a piping defect) connected between the first and second contacts 240 and 230, the first and second contacts 240 and 230 are not electrically isolated due to the unwanted electrical connection P. Therefore, when the first and second contacts 240 and 230 are observed by SEM or other suitable techniques, the images of the first and second contacts 240 and 230 may have substantially the same brightness. As a result, the unwanted electrical connection P can be detected according to brightness contrast between images of the contacts. Formation of ILD layer 270, the first, second and third contacts 240, 230, and 250 may comprise a damascene process, for example, as shown in FIGS. 5-8.

Figure 11:
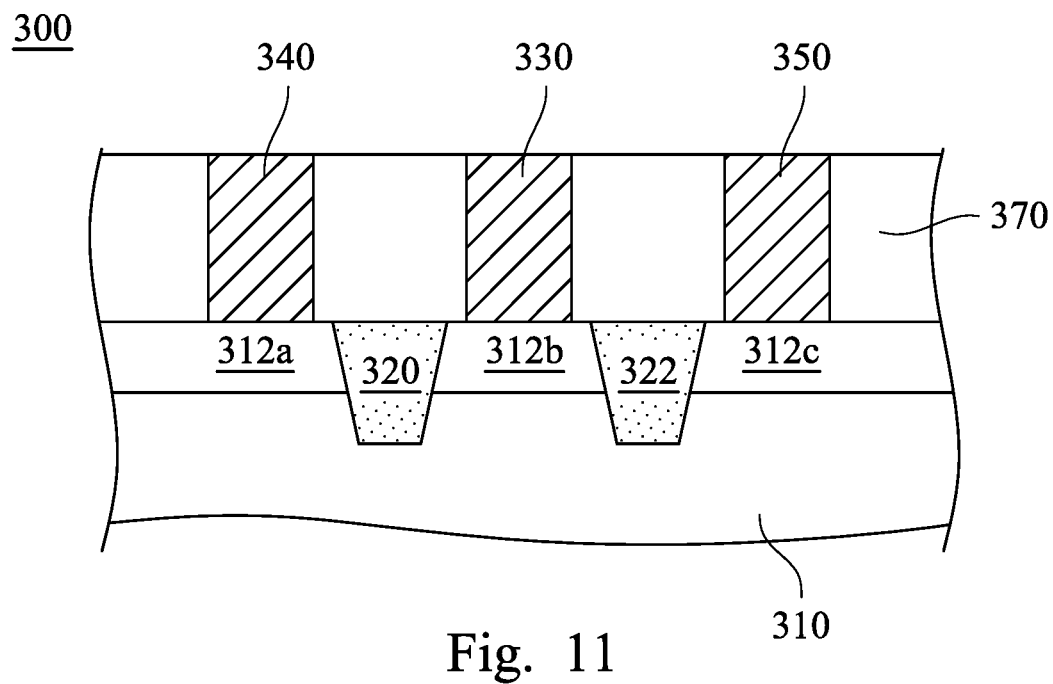
FIG. 11 is a cross-sectional view of a dummy structure in accordance with some embodiments of the present disclosure.

FIG. 11 is a cross-sectional view of a dummy structure 300 in accordance with some embodiments of the present disclosure. As shown in FIG. 11, the dummy structure 300 includes a substrate 310, a first isolation structure 320 in a trench of the substrate 310, and a second isolation structure 322 in another trench of the substrate 310. The substrate 310 may comprise a semiconductor material as discussed previously. The first and second isolation structures 320 and 322 may be referred to as first and second STI structures 320 and 322, and may comprise a dielectric material as discussed previously. The dummy structure 300 further includes first, second, and third doped active regions 312a, 312b, and 312c formed in the substrate 310 using implant processes. Any neighboring two of the first, second, and third doped regions 312a, 312b, and 312c are doped with different types of impurities (or dopants). For example, the first and third doped regions 312a and 312c can be doped with n-type impurities, such as phosphorus or arsenic, such as boron or BF$_2$, and the second doped region 312b can be doped with a p-type impurity, and vice versa.

The dummy structure 300 includes first contacts 340 on the first doped region 312a, second contacts 330 on the second doped region 312b, and third contacts 350 on the third doped region 312c. For example, the first contacts 340 are in contact with the first doped region 312a, and the second contacts 330 are in contact with the second doped region 312b, and the third contacts 350 are in contact with the third doped region 312c, and hence the first and third contacts 340 and 350 may have electrical resistances different from electrical resistances of the second contacts 330. Such an electrical resistance difference between the first and second contacts 340 and 330 may be advantageous to detect an unwanted electrical connection between the first and second contacts 340 and 330. Similarly, the electrical resistance difference between the second and third contacts 330 and 350 may be advantageous to detect an unwanted electrical connection between the second and third contacts 330 and 350.

Figure 12:
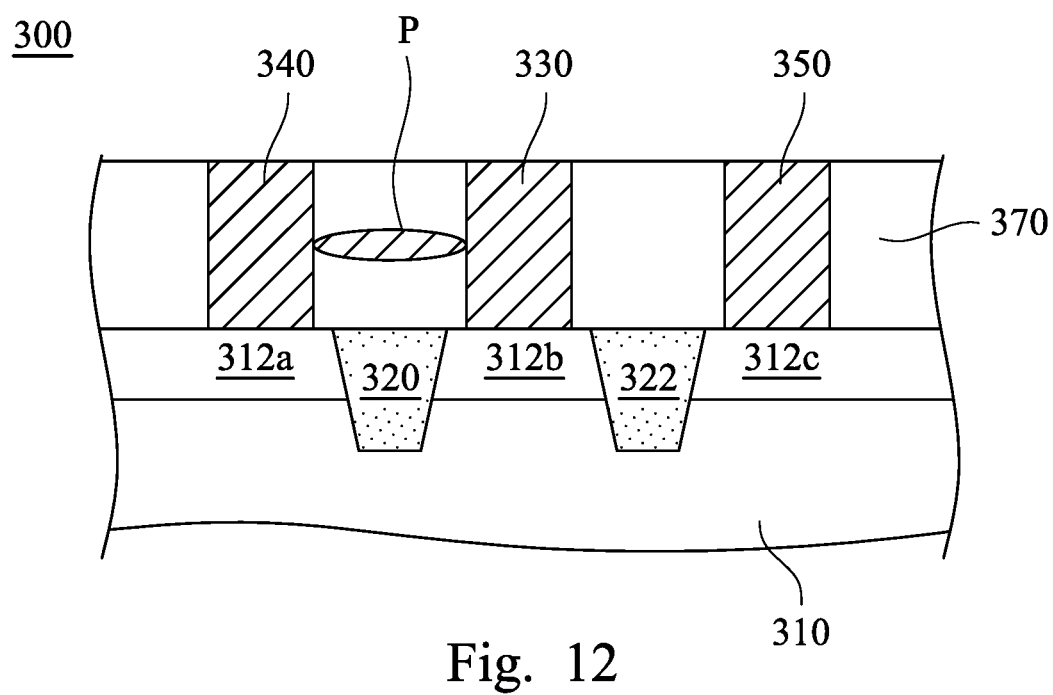
FIG. 12 is a cross-sectional view of a dummy structure with an unwanted electrical connection between contacts in accordance with some embodiments of the present disclosure.

For example, in the depicted embodiments where the first and second contacts 340 and 330 are free from unwanted electrical connections (e.g. piping defects), when the first and second contacts 340 and 330 are observed by SEM or other suitable techniques, the images of the first and second contacts 240 and 230 may have different brightness due to the electrical resistance difference between the first and second contacts 240 and 230. On the other hand, as shown in FIG. 12, which illustrates an unwanted electrical connection P (e.g. a piping defect) connected between the first and second contacts 340 and 330, the first and second contacts 340 and 330 are not electrically isolated due to the unwanted electrical connection P. Therefore, when the first and second contacts 340 and 330 are observed by SEM or other suitable techniques, the images of the first and second contacts 340 and 330 may have substantially the same brightness. As a result, the unwanted electrical connection P can be detected according to brightness contrast between images of the contacts. Formation of ILD layer 370, the first, second and third contacts 340, 330, and 350 may comprise a damascene process, for example, as shown in FIGS. 5-8.

Figure 13:
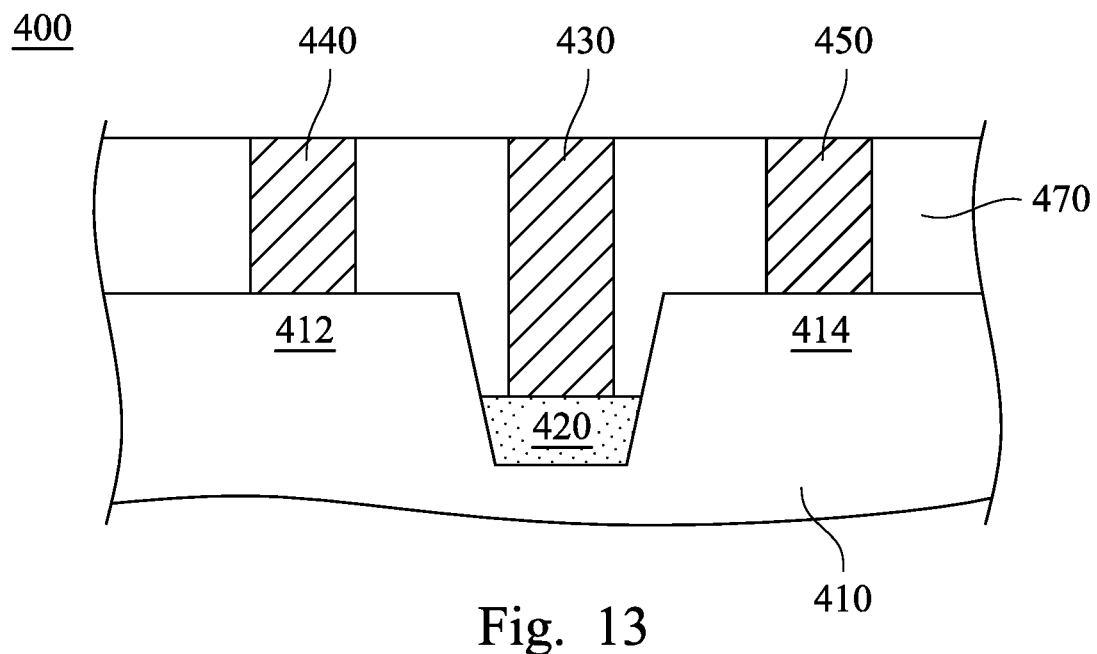
FIG. 13 is a cross-sectional view of a dummy structure in accordance with some embodiments of the present disclosure.

FIG. 13 is a cross-sectional view of a dummy structure 400 in accordance with some embodiments of the present disclosure. As shown in FIG. 13, the dummy structure 400 includes a substrate 410 and an isolation structure 420 in a trench of the substrate 410. The substrate 410 may comprise a semiconductor material as discussed previously. The isolation structure 420 may be referred to as an STI structure 420 and may comprise a dielectric material as discussed previously. The STI structure 420 has a top surface in a position lower than top surfaces of first and second active regions 412 and 414 of the substrate 410, and hence the first and second active regions 412 and 414 can be formed as fin-shaped structures protruding from the top surface of the STI structure 420, and hence the first and second active regions 412 and 414 can be referred to as first and second semiconductor fins 412 and 414 hereinafter respectively.

As shown in FIG. 13, the dummy structure 400 includes first contacts 440 on the first semiconductor fin 412, second contacts 430 on the STI structure 420, and third contacts 450 on the second semiconductor fin 414. For example, the first contacts 440 are in contact with the first semiconductor fin 412, and the second contacts 430 are in contact with the STI structure 420, and the second contacts 450 are in contact with the second semiconductor fin 414, and hence the first and third contacts 440 and 450 may have electrical resistances different from electrical resistances of the second contacts 430. More particularly, the first and third contacts 440 and 450 are electrically isolated from the second contacts 430 at least by the STI structure 420. Such an electrical isolation between the first and second contacts 440 and 430 and between the third and second contacts 450 and 430 may be advantageous to detect an unwanted electrical connection between the first and second contacts 440 and 430 or between the third and second contacts 450 and 430.

Figure 14:
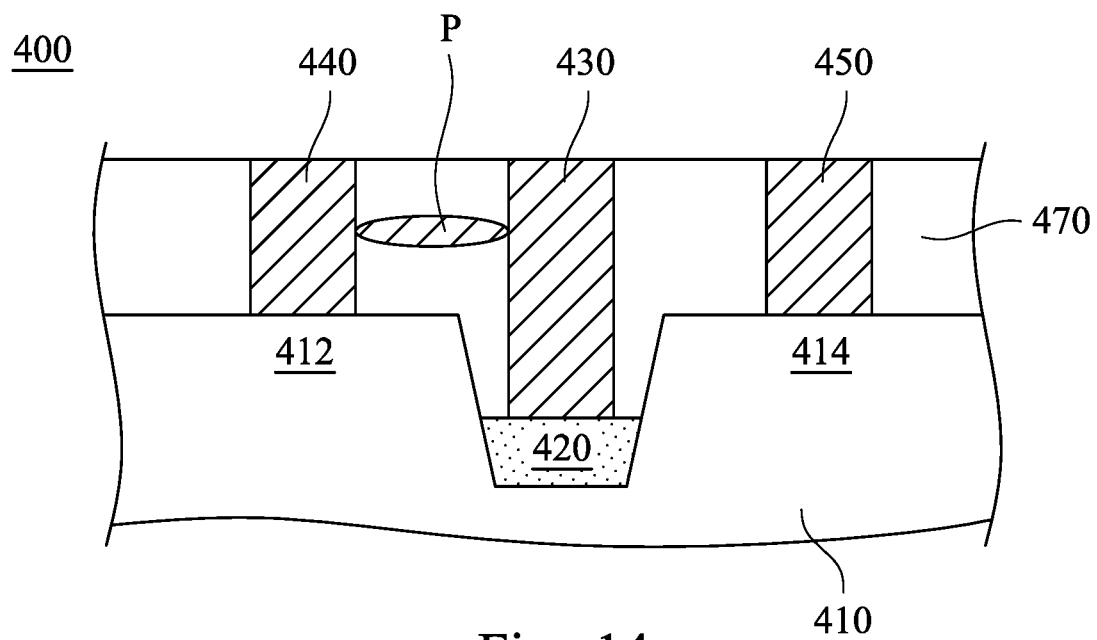
FIG. 14 is a cross-sectional view of a dummy structure with an unwanted electrical connection between contacts in accordance with some embodiments of the present disclosure.

For example, in the depicted embodiments where the first and second contacts 440 and 430 are free from unwanted electrical connections (e.g. piping defects), the first and second contacts 440 and 430 can be electrically isolated at least by the STI structure 420. Therefore, when the first and second contacts 440 and 430 are observed by SEM or other suitable techniques, the image of the second contact 430 may be darker than the image of the first contact 440. On the other hand, as shown in FIG. 14, which illustrates an unwanted electrical connection P (e.g. a piping defect) connected between the first and second contacts 440 and 430, the first and second contacts 440 and 430 are not electrically isolated due to the unwanted electrical connection P. Therefore, when the first and second contacts 440 and 430 are observed by SEM or other suitable techniques, the images of the first and second contacts 440 and 430 may have substantially the same brightness. As a result, the unwanted electrical connection P can be detected according to brightness contrast between images of the contacts. Formation of ILD layer 470, the first, second and third contacts 440, 430, and 450 may comprise a damascene process, for example, as shown in FIGS. 5-8.

Embodiments of the present disclosure allow contacts of the dummy structure to land on features having different electrical resistances. When an electron beam is applied to the contacts landing on features having different electrical resistances, brightness difference between images of the contacts will be observed if there is no unwanted electrical connection (e.g. piping defect) between the contacts. On the other hand, if there is an unwanted electrical connection (e.g. piping defect) between the contacts, substantially the same brightness of images of the contacts will be observed. Therefore, existence of the unwanted electrical connection between contacts can be determined according to brightness contrast between images of the contacts.

According to some embodiments, a method of fabricating a semiconductor structure includes forming first and second features in a scribe region of a semiconductor substrate in which the first feature has a first electrical resistance, the second feature has a second electrical resistance, and the first electrical resistance is different form the second electrical resistance, forming an interlayer dielectric layer over the first and second features, and forming a first contact in the interlayer dielectric layer and connected to the first feature and a second contact in the interlayer dielectric layer and connected to the second feature.

According to some embodiments, a method of fabricating a semiconductor structure includes forming at least one first feature and a second feature on a semiconductor substrate in which the first feature has a first electrical resistance, the second feature has a second electrical resistance, and the first electrical resistance is different form the second electrical resistance, forming an interlayer dielectric layer over the first and second features, forming at least one first contact in the interlayer dielectric layer and connected to the first feature and a second contact in the interlayer dielectric layer and connected to the second feature, and detecting if a short circuit occurs between the first and second contacts according to brightness contrast between images of the first and second contacts.

According to some embodiments, a semiconductor structure includes a semiconductor substrate, a first feature, a second feature, a first contact and a second contact. The semiconductor substrate includes a scribe region. The first feature is in the scribe region. The second feature is in the scribe region. The first feature has a first electrical resistance, the second feature has a second electrical resistance, and the first electrical resistance is different form the second electrical resistance. The first contact is on the first feature. The second contact is on the second feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of testing a semiconductor structure, the method comprising:
    forming a first feature and a second feature on a semiconductor substrate, wherein the first feature has a first electrical resistance, the second feature has a second electrical resistance, and the first electrical resistance is different from the second electrical resistance;
    forming an interlayer dielectric layer over the first and second features;
    forming a first contact in the interlayer dielectric layer and connected to the first feature and a second contact in the interlayer dielectric layer and connected to the second feature;
    capturing an image of the first contact and the second contact;
    detecting a brightness difference between the image of the first contact and the image of the second contact; and
    determining, based on the detected brightness difference, whether a short circuit occurs between the first and second contacts.

2. The method of claim 1, wherein the first and second features are formed in a scribe region between first and second dies on the semiconductor substrate.

3. The method of claim 1, wherein capturing the image comprises:
    applying an electron beam to the first and second contacts to observe the images of the first and second contacts.

4. The method of claim 1, further comprising:
    forming a third feature on the semiconductor substrate, wherein the second feature is formed between the first feature and third feature, forming the interlayer dielectric layer over the third feature,
    forming a third contact in the interlayer dielectric layer and connected to the third feature, wherein the first contact is formed over the first features, and the second contact is formed between the first contact and third contact.

5. A method of testing a semiconductor structure, the method comprising:
    forming an isolation structure and an active region of a semiconductor substrate;
    forming a gate structure across the isolation structure and the active region;
    forming an interlayer dielectric layer over the isolation structure and the active region; forming a first contact directly in contact with the isolation structure and spaced apart from the gate structure by the interlayer dielectric layer and forming a second contact directly in contact with the active region;
    capturing an image of the first contact and the second contact;
    detecting a brightness difference between the image of the first contact and the image of the second contact; and
    determining, based on the detected brightness difference, whether a short circuit occurs between the first and second contacts.

6. The method of claim 5, wherein the isolation structure and the active region are formed in a scribe region of the semiconductor substrate.

7. The method of claim 5, further comprising a third contact connected to the active region, wherein the isolation structure is between the second and third contacts.

8. The method of claim 5, wherein capturing the image comprises:
    applying an electron beam to the first and second contacts.

9. A method of testing a semiconductor structure, the method comprising:
    forming a shallow trench isolation (STI) structure and a first active region defined by the STI structure in a scribe region of a semiconductor substrate, wherein the STI structure comprises a dielectric material;
    forming an interlayer dielectric layer over the first active region and the STI structure;
    etching the interlayer dielectric layer to form a first contact hole and a second contact hole in the interlayer dielectric layer, wherein the first contact hole directly exposes a portion of the first active region, the second contact hole directly exposes a first portion of the dielectric material of the STI structure;
    forming a first contact in the first contact hole and directly in contact with the exposed portion of the first active region and forming a second contact in the second contact hole and directly in contact with the exposed first portion of the dielectric material of the STI structure;
    applying an electron beam to the first and second contacts;
    capturing an image of the first contact and the second contact;
    detecting a brightness difference between the image of the first contact and the image of the second contact; and
    determining, based on the detected brightness difference, whether a short circuit occurs between the first and second contacts.

10. The method of claim 9, wherein etching the interlayer dielectric layer is performed such that a third contact hole is formed in the interlayer dielectric layer and directly exposes a portion of a second active region, and the STI structure is between the first active region and the second active region; and wherein forming the first contact and the second contact is performed such that a third contact is formed in the third contact hole and directly in contact with the exposed portion of the second active region.

11. The method of claim 10, further comprising:
forming a gate structure on the first active region, the STI structure, and the second active region, wherein the first, second, and third contacts are arranged substantially along a direction that is parallel with a lengthwise direction of the gate structure.

12. The method of claim 10, wherein etching the interlayer dielectric layer is performed such that a fourth contact hole is formed in the interlayer dielectric layer and directly exposes a second portion of the dielectric material of the STI structure; and
wherein forming the first contact and the second contact is performed such that a fourth contact is formed in the fourth contact hole and directly in contact with the exposed second portion of the dielectric material of the STI structure.

13. The method of claim 9, further comprising:
forming a first gate structure across opposite edges of a first portion of the STI structure.

14. The method of claim 13, further comprising:
forming a second gate structure across opposite edges of a second portion of the STI structure, wherein the first contact and the second contact are formed between and spaced apart from the first and second gate structures, and the first contact, the second contact, the first gate structure, and the second gate structure are all formed in the scribe region of the semiconductor substrate.

15. The method of claim 9, wherein forming the interlayer dielectric layer is performed such that a void is formed in the interlayer dielectric layer;
wherein etching the interlayer dielectric layer is performed such that the first contact hole communicates with the second contact hole through the void and such that a top of the void is lower than a top of the first contact hole; and
wherein forming the first contact and the second contact is performed such that a conductive material is formed in the void and causes the first contact and the second contact to short circuit.

\* \* \* \* \*